United States Patent
Kim et al.

(10) Patent No.: US 7,470,562 B2
(45) Date of Patent: Dec. 30, 2008

(54) METHODS OF FORMING FIELD EFFECT TRANSISTORS USING DISPOSABLE ALUMINUM OXIDE SPACERS

(75) Inventors: Jong Pyo Kim, Fishkill, NY (US); Andre I. Nasr, Lagrangeville, NY (US)

(73) Assignees: Samsung Electronics Co., Ltd. (KR); International Business Machines Corporation, Armonk, NY (US)

( * ) Notice: Subject to any disclaimer, the term of this patent is extended or adjusted under 35 U.S.C. 154(b) by 110 days.

(21) Appl. No.: 11/268,132

(22) Filed: Nov. 7, 2005

(65) Prior Publication Data

US 2007/0105327 A1 May 10, 2007

(51) Int. Cl.
*H01L 21/16* (2006.01)
*H01L 21/8238* (2006.01)

(52) U.S. Cl. .................. 438/104; 438/230; 438/231

(58) Field of Classification Search ............... 438/199, 438/229, 230, 104
See application file for complete search history.

(56) References Cited

U.S. PATENT DOCUMENTS

| | | | |
|---|---|---|---|
| 5,512,771 A | | 4/1996 | Hiroki et al. |
| 6,127,212 A | * | 10/2000 | Chen et al. ................ 438/199 |
| 6,221,706 B1 | | 4/2001 | Lukanc et al. |
| 6,265,253 B1 | * | 7/2001 | Lukanc et al. ............. 438/199 |
| 6,657,267 B1 | | 12/2003 | Xiang et al. |
| 6,686,248 B1 | | 2/2004 | Yu |
| 7,186,349 B2 | * | 3/2007 | Hu et al. ................... 216/27 |
| 2001/0019127 A1 | * | 9/2001 | Ishida ....................... 257/59 |
| 2003/0057462 A1 | * | 3/2003 | An ............................ 257/295 |
| 2005/0093106 A1 | | 5/2005 | Hu et al. |

FOREIGN PATENT DOCUMENTS

| | | | |
|---|---|---|---|
| JP | 5-218211 | * | 8/1993 |
| JP | 200124445 | | 7/2001 |
| JP | 2004-179445 | | 6/2004 |
| KR | 2001-0064088 A | | 7/2001 |
| KR | 2001-0065190 A | | 7/2001 |
| KR | 100314151 | | 7/2001 |
| KR | 1020010064088 A | | 7/2001 |
| KR | 100372643 | | 1/2002 |
| KR | 2002-0041582 A | | 6/2002 |
| KR | 2002-0057769 A | | 7/2002 |
| KR | 2003-0049896 A | | 6/2003 |

OTHER PUBLICATIONS

Flann, Angela "Preliminary Feasibility Study of Silicon on Insulator (SOI) Microphones", Jul. 27, 2004, University of Pittsburgh, School of Engineering, p. 11-12.*

* cited by examiner

*Primary Examiner*—N Drew Richards
*Assistant Examiner*—Grant S Withers
(74) *Attorney, Agent, or Firm*—Myers Bigel Sibley & Sajovec

(57) ABSTRACT

Methods of forming a field effect transistor by forming a gate electrode on a semiconductor substrate and forming aluminum oxide spacers on sidewalls of the gate electrode. Source and drain region dopants of first conductivity type are implanted into the semiconductor substrate using the aluminum oxide spacers as an implant mask. Thereafter, the aluminum oxide spacers are selectively removed by exposing them to tetramethyl ammonium hydroxide (TMAH). The step of selectively removing the aluminum oxide spacers may include exposing the aluminum oxide spacers to tetramethyl ammonium hydroxide having a temperature of about 80° C.

9 Claims, 4 Drawing Sheets

METHODS OF FORMING FIELD EFFECT TRANSISTORS USING DISPOSABLE ALUMINUM OXIDE SPACERS

FIELD OF THE INVENTION

The present invention relates to integrated circuit fabrication methods and, more particularly, to methods of fabricating field effect transistors.

BACKGROUND OF THE INVENTION

Methods of forming field effect transistors typically include steps that utilize sidewall spacers on gate electrodes as implant masks to define self-aligned source and drain regions within a semiconductor substrate. However, as the degree of integration of field effect transistors within integrated circuits continues to increase, the spacing between adjacent gate electrodes frequently decreases. As will be understood by those skilled in the art, this decrease in spacing between adjacent gate electrodes may cause the formation of unwanted material residues (e.g, insulating material) in the spacing during deposition and etch-back of sidewall spacers. To address this problem, sacrificial sidewall spacers have been used to reduce the likelihood of formation of material residues by increasing the effective spacing between adjacent electrodes. Unfortunately, many sacrificial sidewall spacers may be formed of materials that do not support sufficient etching selectivity relative to surrounding materials. Accordingly, the use of conventional sacrificial sidewall spacer materials may not provide sufficient prevention of material residues during fabrication.

SUMMARY OF THE INVENTION

Embodiments of the invention include methods of forming a field effect transistor by forming a gate electrode on a semiconductor substrate and forming aluminum oxide spacers on sidewalls of the gate electrode. Source and drain region dopants of first conductivity type are implanted into the semiconductor substrate using the aluminum oxide spacers as an implant mask. Thereafter, the aluminum oxide spacers are selectively removed by exposing them to tetramethyl ammonium hydroxide (TMAH). The step of selectively removing the aluminum oxide spacers may include exposing the aluminum oxide spacers to tetramethyl ammonium hydroxide having a temperature in a range from about 40° C. to about 100° C. and, more particularly, about 80° C. After the aluminum oxide spacers have been selectively removed, a step may be performed to expose the gate electrode to a diluted hydrogen fluoride (DHF) cleaning solution. According to additional aspects of these embodiments, the step of forming aluminum oxide spacers may include depositing a blanket layer of aluminum oxide on the gate electrode and etching back the blanket layer of aluminum oxide to define the aluminum oxide spacers. This step of etching back the blanket layer may include dry etching the blanket layer.

Additional embodiments of the invention include methods of forming an integrated circuit device by forming a first gate electrode of a PMOS transistor and a second gate electrode of an NMOS transistor on a semiconductor substrate. Aluminum oxide spacers are formed on sidewalls of the first and second gate electrodes and a protective cap is formed to cover the first gate electrode of the PMOS transistor. The aluminum oxide spacers associated with the second gate electrode are selectively etched (but not entirely removed) by exposing them to tetramethyl ammonium hydroxide (TMAH). During this etching step, the protective cap is used as an etching mask to protect the first gate electrode from TMAH. Thereafter, source and drain region dopants of N-type conductivity type are implanted into the semiconductor substrate, using the aluminum oxide spacers associated with the second gate electrode as an implant mask. According to further aspects of these embodiments, the step of forming a protective cap may be preceded by a step of implanting source and drain region dopants of P-type conductivity type into the semiconductor substrate, using the aluminum oxide spacers associated with the first gate electrode as an implant mask.

BRIEF DESCRIPTION OF THE DRAWINGS

FIGS. 1A-1K are cross-sectional views of intermediate structures that illustrate methods of forming field effect transistors according to embodiments of the present invention.

DETAILED DESCRIPTION OF PREFERRED EMBODIMENTS

Figure 1A:
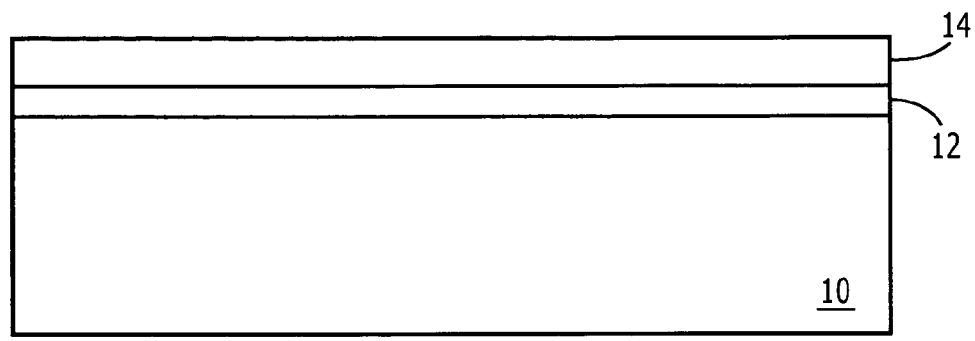

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 1B:
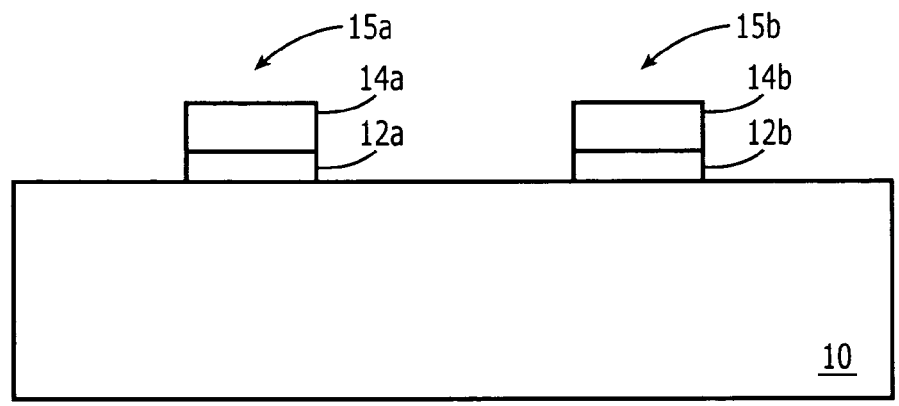

Referring now to FIGS. 1A-1B, methods of forming field effect transistors according to embodiments may include forming gate electrodes of NMOS and PMOS transistors on a semiconductor substrate by forming a gate electrode insulating layer 12 (e.g., gate oxide layer) on a primary surface of a semiconductor substrate 10 and forming an electrically conductive gate electrode layer 14 on the gate electrode insulating layer 12. As will be understood by those skilled in the art, the gate electrode insulating layer 12 may be a silicon dioxide layer and the electrically conductive gate electrode layer 14 may be a doped or undoped polysilicon layer, for example. These layers 12 and 14 are then patterned to define a first insulated gate electrode 15a (containing regions 12a, 14a) and a second insulated gate electrode 15b (containing regions 12b, 14b).

Figure 1C:
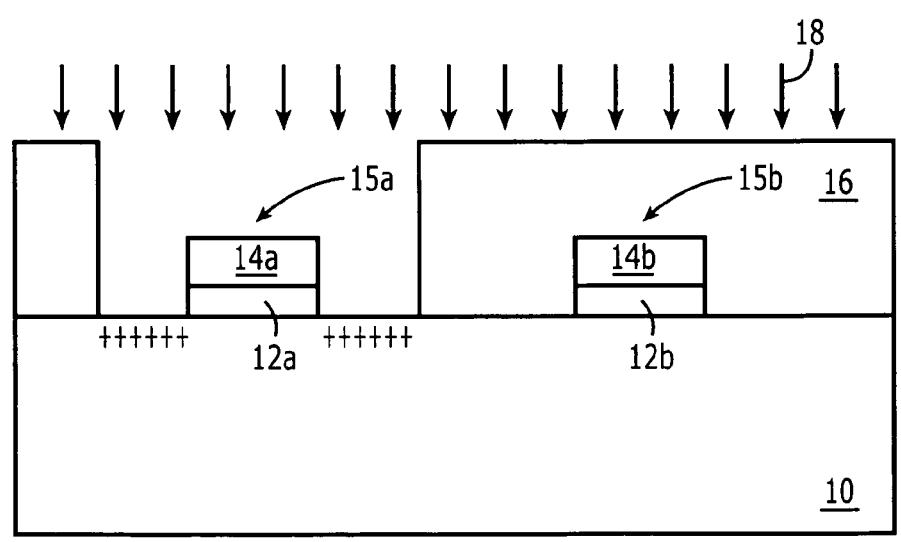
Figure 1D:
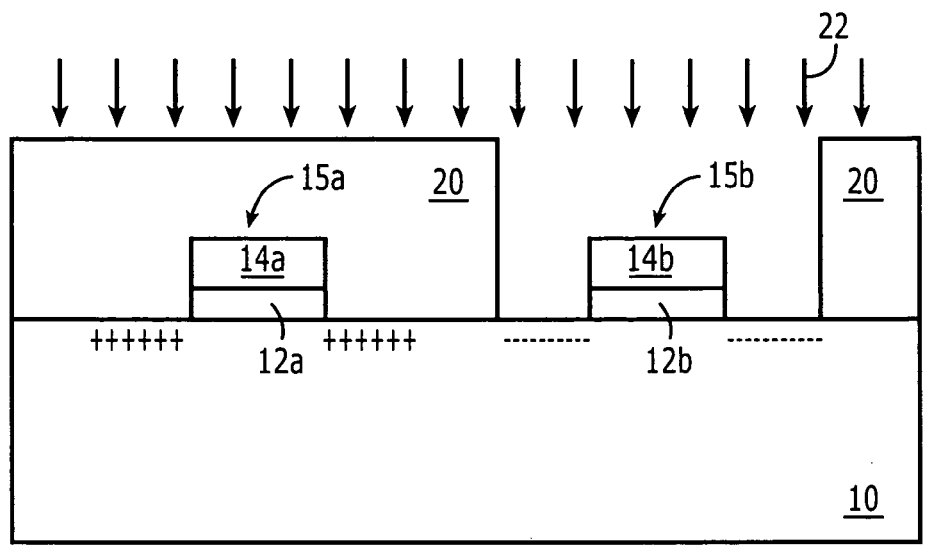

Thereafter, as illustrated by FIG. 1C, a first masking layer 16 is deposited on the substrate 10 and then selectively patterned to expose the first insulated gate electrode 15a and cover the second insulated gate electrode 15b. Source and drain region dopants 18 of first conductivity type (e.g., P-type dopants) are then implanted into the substrate 10, using the patterned first masking layer 16 as an implant mask. These source and drain region dopants 18 may be implanted to define preliminary LDD regions (i.e., lightly doped source/drain regions (shown by "+")) on opposite sides of the first insulated gate electrode 15a. The patterned first masking layer 16 may then be removed. Referring now to FIG. 1D, a second masking layer 20 is deposited on the substrate 10 and then selectively patterned to expose the second insulated gate electrode 15b and cover the first insulated gate electrode 15a. Source and drain region dopants 22 of second conductivity type (e.g., N-type dopants) are then implanted into the substrate 10, using the patterned second masking layer 20 as an implant mask. These source and drain region dopants 22 may be implanted to define preliminary LDD regions (i.e., lightly doped source/drain regions (shown by "−")) on opposite sides of the second insulated gate electrode 15b. As will be understood by those skilled in the art, the sequence of steps illustrated by FIGS. 1C-1D may be reversed in alternative embodiments of the invention.

Figure 1E:
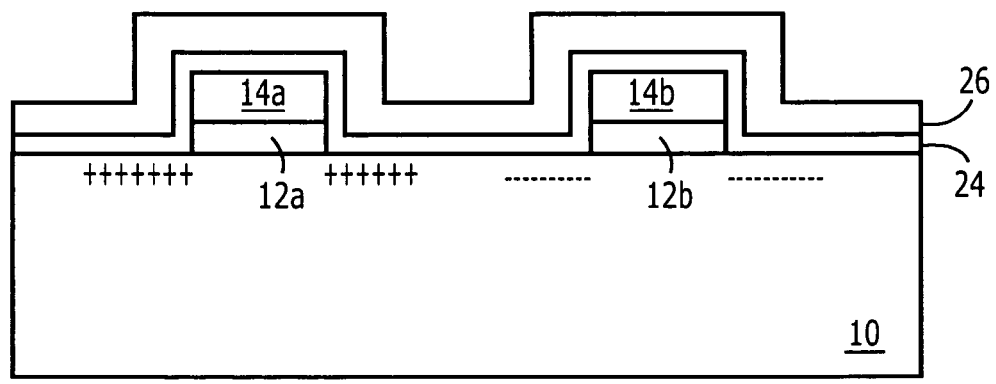

Referring now to FIG. 1E, a sidewall insulating layer 24 (e.g., low temperature oxide (LTO) layer)) may be conformally deposited on the first and second gate electrodes 15a, 15b, as illustrated. This deposition step may then be followed by a step of conformally depositing an aluminum oxide layer 26 on the sidewall insulating layer 24. According to some embodiments of the present invention, this aluminum oxide layer 26, which may be deposited using an atomic layer deposition (ALD) or chemical vapor deposition (CVD) technique, for example, may have a thickness in a range from about 30 Å to about 1000 Å. The aluminum oxide layer 26 may also be advantageously deposited at a relatively low temperature, which may be less than about 500° C.

Figure 1F:
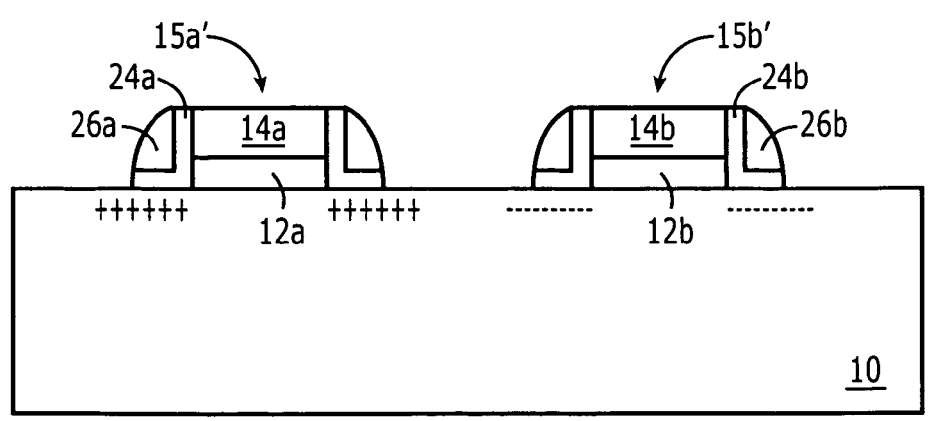

Thereafter, as illustrated by FIG. 1F, with a high degree of etching selectivity, the aluminum oxide layer 26 may be etched back by exposing the aluminum oxide layer 26 to tetramethyl ammonium hydroxide (TMAH) solution for a sufficient duration to expose the sidewall insulating layer 24. For increased etching selectivity, the TMAH solution may have an elevated temperature in a range from about 40° C. to about 100° C. and, more preferably, in a range from about 70° C. to about 90° C. For example, the TMAH solution may have a temperature of about 80° C. to achieve a sufficiently high etch rate, which is a function of TMAH temperature. As illustrated, this controlled etching of the aluminum oxide layer 26 results in the formation of sacrificial aluminum oxide spacers 26a and 26b. Another selective etching step may then be performed to selectively etch back the sidewall insulating layer 24 to define sidewall spacers 24a and 24b on the first and second gate electrodes 15a' and 15b', respectively, and expose the substrate 10. During this selective etch-back step, the aluminum oxide spacers 26a and 26b may be used as localized etching masks. A dilute hydrofluoric (DHF) solution may then be used as a cleaning solution to remove material residues and contaminants from the substrate 10.

Figure 1G:
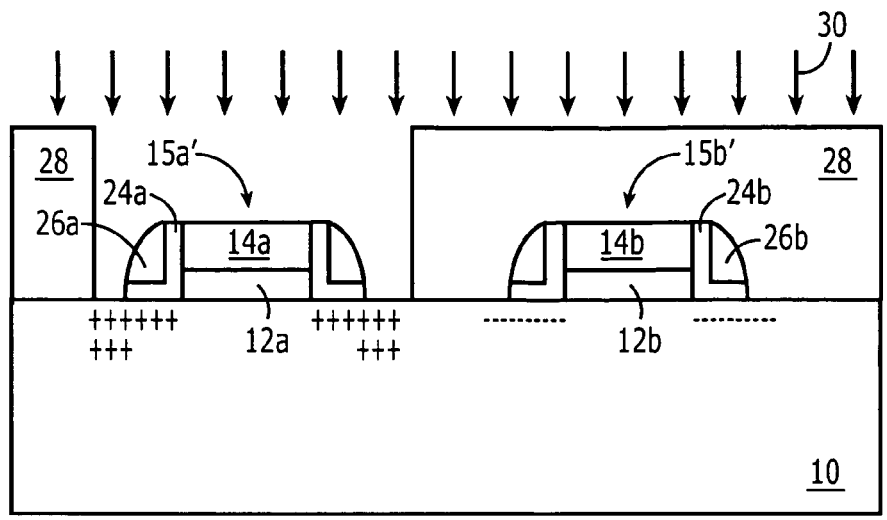
Figure 1H:
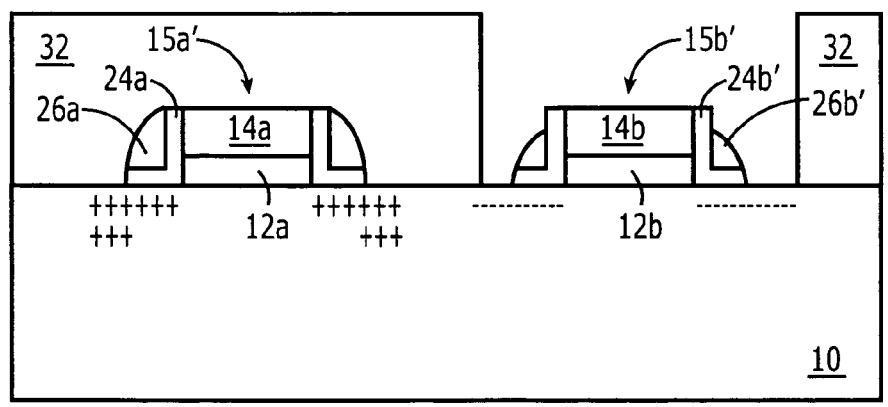
Figure 1J:
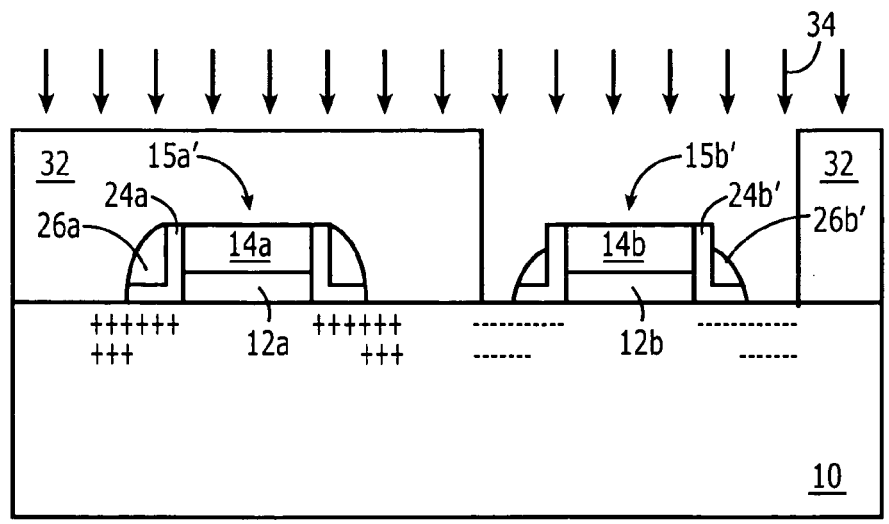
Figure 1K:
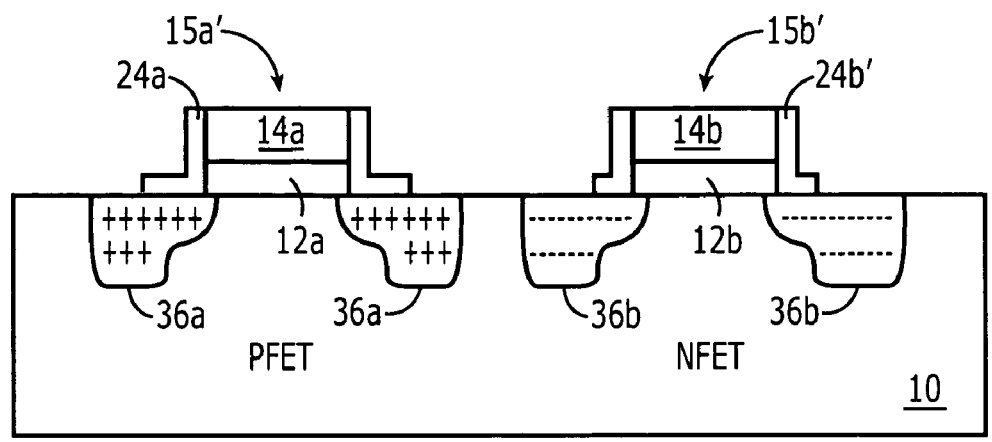

Referring now to FIG. 1G, a third masking layer 28 is deposited on the substrate 10 and selectively patterned to expose the first insulated gate electrode 15a' and cover the second insulated gate electrode 15b'. Source and drain region dopants 30 of first conductivity type (e.g., P-type dopants) are then implanted into the substrate 10, using the patterned third masking layer 28 and aluminum oxide spacers 26a as implant masks. These source and drain region dopants 30 may be implanted to define more highly doped source and drain regions on opposite sides of the first insulated gate electrode 15a'. As illustrated by FIG. 1H, a fourth masking layer 32 is deposited on the substrate 10 and selectively patterned to expose the second insulated gate electrode 15b' and cover the first insulated gate electrode 15a'. This patterned fourth masking layer 32 is utilized as a protective cap during a step to reduce the lateral dimensions of the aluminum oxide spacers 26b. In particular, the aluminum oxide spacers 26b of FIG. 1G are further etched by exposing the spacers 26b to tetramethyl ammonium hydroxide (TMAH) for a sufficient duration to reduce their lateral dimensions and define etched-back spacers 26b'. This step of reducing the lateral dimensions of the spacers 26b' enables subsequently formed source and drain regions (e.g., N-type source/drain regions) to be closer to each other, whereas the source and drain regions associated with the first gate electrode may remain sufficiently spaced to inhibit short-channel parasitics by maintaining the lateral dimensions of the spacers 26a. In some embodiments of the present invention, this step of further exposing the spacers 26b to TMAH may result in spacer pullback and further exposure of the sidewall spacers 24b extending along the primary surface of the substrate 10. Accordingly, these sidewall spacers 24b may be further etched to define etched-back sidewall spacers 24b'. Thereafter, as illustrated by FIG. 1J, source and drain region dopants 34 of second conductivity type may be implanted to define more highly doped source and drain regions on opposite sides of the second insulated gate electrode 15b'. During this implant step, the patterned fourth masking layer 32 and the spacers 26b' may be used as implant masks. Referring now to FIG. 1K, an additional step may be performed to remove the patterned fourth masking layer 32 and then completely remove the sacrificial aluminum oxide spacers 26a and 26b' by exposing these spacers to a TMAH solution (e.g., at an elevated temperature in a range from about 70° C. to about 90° C.) and then performing a cleaning step using a diluted HF (hydrofluoric acid) solution. A dopant drive-in step(s) may then performed to drive-in and activate the implanted dopants to thereby define P-type source and drain regions 36a and N-type source and drain regions 36b. The patterned fourth masking layer 32 may also be removed to define a PMOS transistor (PFET) and an NMOS transistor (NFET), as illustrated by FIG. 1K. Subsequent processing steps (not shown) may then be performed to define interlayer insulating layers, conductive interconnects and metallization layers, for example, and complete an integrated circuit device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method forming a field effect transistor, comprising the steps of:
    forming a gate electrode on a semiconductor substrate;
    depositing a sidewall insulating layer and an aluminum oxide layer in sequence on the gate electrode and the semiconductor substrate;
    forming aluminum oxide ($Al_2O_3$) spacers on the sidewall insulating layer by selectively etching back the aluminum oxide layer using tetramethyl ammonium hydroxide;
    selectively etching back the sidewall insulating layer to define sidewall spacers on the gate electrode, using the aluminum oxide spacers as a localized etching mask;
    implanting source and drain region dopants of first conductivity type into the semiconductor substrate, using the aluminum oxide spacers as an implant mask; and
    removing the aluminum oxide spacers by exposing the aluminum oxide spacers to tetramethyl ammonium hydroxide.

2. The method of claim 1, wherein said removing comprises selectively removing the aluminum oxide spacers by exposing the aluminum oxide spacers to tetramethyl ammonium hydroxide having a temperature in a range from about 40° C. to about 100° C.

3. The method of claim 1, wherein said step of removing the aluminum oxide spacers is followed by the step of exposing the gate electrode to a diluted hydrogen fluoride (DHF) cleaning solution.

4. A method forming an integrated circuit device:

forming a first gate electrode of a PMOS transistor and a second gate electrode of an NMOS transistor on a semiconductor substrate;

forming a sidewall insulating layer and an aluminum oxide layer in sequence on the first and second gate electrodes and the semiconductor substrate;

forming aluminum oxide ($Al_2O_3$) spacers on sidewalls of the first and second gate electrodes by selectively etching back the aluminum oxide layer using tetramethyl ammonium hydroxide and thereby exposing the sidewall insulating layer;

selectively etching back the sidewall insulating layer to define sidewall spacers on the first and second gate electrodes, using the aluminum oxide spacers as a localized etching mask;

forming a protective cap covering the first gate electrode;

selectively etching the aluminum oxide spacers associated with the second gate electrode by exposing the aluminum oxide spacers to tetramethyl ammonium hydroxide (TMAH), using the protective cap as an etching mask to protect the first gate electrode from TMAH; and then implanting source and drain region dopants of N-type conductivity type into the semiconductor substrate, using the aluminum oxide spacers associated with the second gate electrode as an implant mask.

5. The method of claim 4, wherein said step of forming a protective cap is preceded by the step of implanting source and drain region dopants of P-type conductivity type into the semiconductor substrate, using the aluminum oxide spacers associated with the first gate electrode as an implant mask.

6. The method of claim 4, wherein said step of implanting source and drain region dopants of N-type conductivity is followed by a step of selectively etching the aluminum oxide spacers associated with the first and second gate electrodes by exposing the aluminum oxide spacers to TMAH.

7. The method of claim 4, wherein said step of forming aluminum oxide spacers on sidewalls of the first and second gate electrodes is preceded by the step of implanting source and drain region dopants of P-type conductivity into the semiconductor substrate, using the first gate electrode as an implant mask.

8. The method of claim 4, wherein said step of forming aluminum oxide spacers on sidewalls of the first and second gate electrodes is preceded by the step of implanting source and drain region dopants of N-type conductivity into the semiconductor substrate, using the second gate electrode as an implant mask.

9. The method of claim 4, wherein said step of selectively etching the aluminum oxide spacers comprises selectively etching the aluminum oxide spacers associated with the second gate electrode by exposing the aluminum oxide spacers to tetramethyl ammonium hydroxide (TMAH) having a temperature in a range from about 70° C. to about 90° C.

* * * * *